(12) United States Patent
Van Der Sluis et al.

(10) Patent No.: US 7,291,505 B2
(45) Date of Patent: Nov. 6, 2007

(54) METHOD OF MANUFACTURING A FERROELECTRIC DEVICE

(75) Inventors: Paul Van Der Sluis, Eindhoven (NL); Martijn Henri Richard Lankhorst, Eindhoven (NL); Ronald Martin Wolf, Eindhoven (NL)

(73) Assignee: NXP B.V., Eindhoven (NL)

( * ) Notice: Subject to any disclaimer, the term of this patent is extended or adjusted under 35 U.S.C. 154(b) by 296 days.

(21) Appl. No.: 10/524,981

(22) PCT Filed: Jul. 10, 2003

(86) PCT No.: PCT/IB03/03189

§ 371 (c)(1),
(2), (4) Date: Feb. 18, 2005

(87) PCT Pub. No.: WO2004/019410

PCT Pub. Date: Mar. 4, 2004

(65) Prior Publication Data

US 2005/0269611 A1 Dec. 8, 2005

(30) Foreign Application Priority Data

Aug. 20, 2002 (EP) ................... 02078438
Jan. 24, 2003 (EP) ................... 03100146

(51) Int. Cl.
*H01L 21/00* (2006.01)
(52) U.S. Cl. ........... 438/3; 257/E21.663; 257/E21.664; 257/295; 438/239
(58) Field of Classification Search ............... 438/84, 438/86, 95, 3; 257/295, E21.663
See application file for complete search history.

(56) References Cited

U.S. PATENT DOCUMENTS

| 5,146,299 | A | * | 9/1992 | Lampe et al. | 257/295 |
| 5,303,182 | A | * | 4/1994 | Nakao et al. | 365/145 |
| 5,512,773 | A | * | 4/1996 | Wolf et al. | 257/471 |
| 5,965,942 | A | * | 10/1999 | Itoh et al. | 257/761 |

FOREIGN PATENT DOCUMENTS

| EP | 0 660 412 | 6/1995 |
| JP | 11 286772 | 10/1999 |

* cited by examiner

*Primary Examiner*—Jerome Jackson
*Assistant Examiner*—Paul Budd
(74) *Attorney, Agent, or Firm*—Peter Zawilski

(57) ABSTRACT

The invention relates to a ferroelectric device (10) with a body (11) comprising a substrate (1) and a ferroelectric layer (2) provided with a connection conductor (3) on a side facing away from the substrate (1), which ferroelectric layer contains an oxygen-free ferroelectric material (2) and is used to form an active electrical element (4), in particular a memory element (4). Such a device forms an attractive non-volatile memory device. In accordance with the invention, a conductive layer (5) is present between the substrate (1) and the ferroelectric layer (2), which conductive layer forms a further connection conductor (5) of the ferroelectric layer (2), and the active electrical element (4) is obtained as a result of the fact that the ferroelectric layer (2) forms a Schottky junction with at least one of the connection conductors (3, 5). In practice it has been found that such a device (10) comprises a well-performing memory element (4) that can be readily formed on a, preferably monocrystalline, silicon substrate (1). Preferably, the device (10) further comprises a field effect transistor (6), and the element (4) is preferably situated above the source or drain region (7) of the transistor (6). The active element also may function as a diode.

15 Claims, 3 Drawing Sheets

METHOD OF MANUFACTURING A FERROELECTRIC DEVICE

Figure 1:
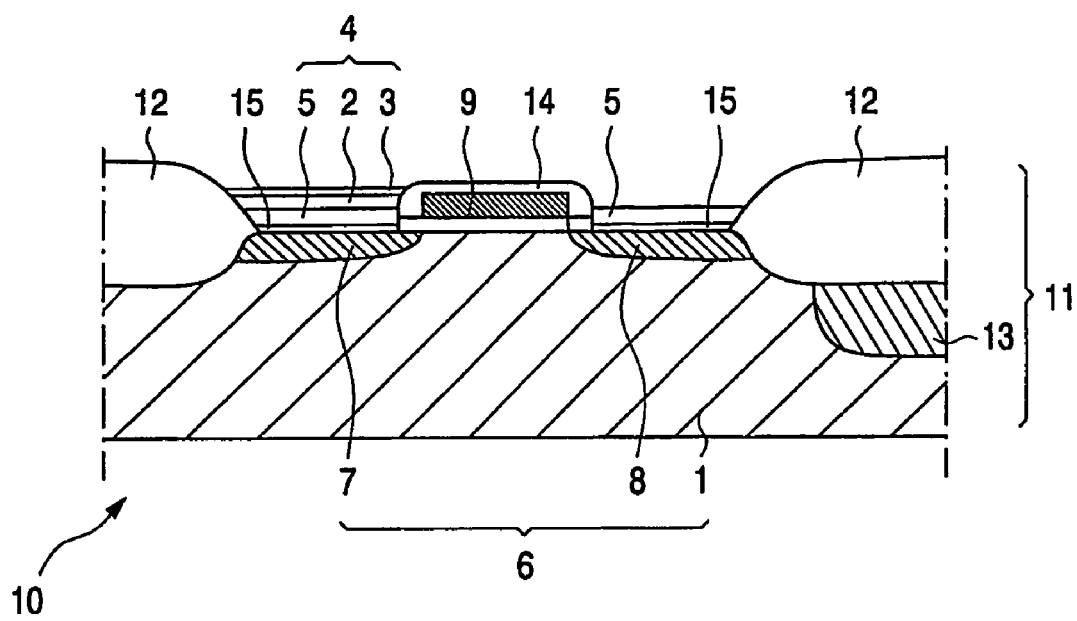

The invention relates to a ferroelectric device with a body comprising a substrate and a ferroelectric layer provided with a connection conductor on a side facing away from the substrate, which ferroelectric layer contains an oxygen-free ferroelectric material and is used to form an active electrical element. In case the active electrical element is a memory element, such a device constitutes a non-volatile memory and as such forms an attractive alternative to a non-volatile semiconductor memory element, partly due to the fact that it can be read very many times. The presence of an oxygen-free ferroelectric material in the dielectric layer has the important advantage that a reaction with the adjoining semiconductor material, causing the formation of an electrically insulating oxide that might adversely affect the electrical properties of the device, is precluded. The invention also relates to a method of manufacturing such a device.

A device of a type mentioned in the opening paragraph is known from United States patent specification U.S. Pat. No. 5,373,176, published on 13 Dec. 1994. In said specification a description is given of an MFS (=Metal Ferroelectric Semiconductor) structure comprising a ferroelectric layer which is provided on a CdTe semiconductor substrate and on which a gate electrode is present, which MFS structure is used to form a memory element comprising a part of the substrate and two doped regions present in the substrate. The ferroelectric layer contains an oxygen-free ferroelectric material in the form of a chalcogenide comprising ZnCdTe. The advantage of such a device is that, by virtue of epitaxial growth of the ferroelectric layer on the substrate, a high-quality interface between the (CdTe) substrate and the (ZnCdTe) ferroelectric layer can be achieved, which is necessary to obtain a properly functioning device.

In this application, chalcogenide is to be taken to mean a material that comprises a compound of at least an element, preferably a metal, and at least one of the elements S, Se and Te. Of course this compound also includes in particular mixed crystals having for example the composition $A1_xA2_{1-x}B$, where A1 comprises one or more of the elements Zn, Cd, Hg, Al, Ga, In or Tl, A2 comprises one or more of the elements Si, Ge, Sn and Pb, and B comprises one or ore of the elements S, Se, Te, the value of x ranging between 0 and 1. Furthermore, it is to be noted that in this application, oxygen free is to be taken to mean that there is no intentional addition of oxygen into the ferroelectric material nor any intentional doping thereof with oxygen. Thus, the ferroelectric material only does contain oxygen insofar as unavoidable when using high purity materials and processing.

A drawback of the known device resides in that it requires the ferroelectric layer to be grown directly on the semiconductor substrate, which is difficult, in particular, if the substrate contains Si.

Therefore, it is an object of the present invention to provide a device which can be formed also on other substrates, such as a silicon substrate. In addition, the device should be easy to manufacture.

To achieve this, in accordance with the invention, a device of the type mentioned in the opening paragraph is characterized in that a conductive layer is situated between the substrate and the ferroelectric layer, which conductive layer forms a further connection conductor of the ferroelectric layer, and the active electrical element is formed as a result of the fact that the ferroelectric layer forms a Schottky junction with at least one of the connection conductors. The invention is based first of all on the recognition that epitaxial growth is not necessary to obtain a memory effect in a ferroelectric material. Also if the material is polycrystalline, it can be used if the crystals of the polycrystalline layer are at least predominantly ordered. The materials in question exhibit this behavior, the crystals most frequently being oriented in the direction of fastest growth. In the case of the materials considered here, this direction generally corresponds to a direction which extends substantially perpendicularly to the thickness direction of a layer grown. As a result, also a non-monocrystalline layer, which is generally true for a conductive or insulating layer, may be situated between a monocrystalline substrate and the ferroelectric layer. Even the substrate does not have to be monocrystalline. The invention is further based on the recognition that by choosing a conductive layer as an intermediate layer, if this conductive layer further serves as a connection conductor, still a memory element is formed by means of the ferroelectric layer on the proviso that at least one of the junctions of the ferroelectric layer with the connection conductor and the further connection conductor is embodied so as to be a Schottky junction. As a result, the ferroelectric layer does not have to be provided on the semiconductor substrate, which also enables a device of the desired properties to be formed using a silicon substrate. Charge carriers may tunnel through the Schottky barrier associated with the Schottky junction, and the conductivity of the element may be influenced by changing the polarization, as a result of which the size of the depletion region is changed. The memory element can be switched very many times between two states.

An additional advantage of a device in accordance with the invention resides in that the manufacture thereof is very compatible with the method customarily used to manufacture silicon devices. The final process step of this method is preferably a so-termed annealing step in a hydrogen atmosphere. By virtue of the fact that the materials used, for example chalcogenide materials as defined hereinabove, do not contain oxygen, such a process step is permissible. If the ferroelectric layer contained oxygen, then hydrogen would readily influence the stoichiometry of the ferroelectric layer and hence the properties of said layer. By virtue of the fact that the dielectric layer contains an oxygen-free ferroelectric material, a reaction between the ferroelectric material and one of the adjoining metal layers, causing the formation of an electrically insulating oxide that might adversely affect the electrical properties of the device, is precluded. Finally, an important advantage resides in that said ferroelectric materials generally can be manufactured at a comparatively low temperature. This too facilitates integration within the silicon technology.

In a preferred embodiment of a device in accordance with the invention, the active electrical element is a memory element. Preferably, in a device in accordance with the invention, the body comprises—in accordance with the above explanation—a semiconductor body, and the substrate comprises a, preferably monocrystalline, semiconductor substrate. A substrate which is customary per se, such as a (100)-oriented monocrystalline silicon substrate is very suitable.

In a particularly favorable modification, a device in accordance with the invention also comprises a field effect transistor with a source region, a drain region and a gate electrode, and the further connection conductor is situated on the source region or the drain region of the field effect transistor and also serves as a connection conductor of the source region or the drain region. Such a transistor can very suitably be used as a selection means if the semiconductor device comprises a large number of memory elements, which is often desirable in practice. In addition, such a transistor can be very readily manufactured using, in particular, the technology that is based on the use of silicon as the semiconductor substrate. By virtue of the fact that the further connection conductor also serves as (one of the) connection conductor(s) of the transistor, the manufacture is comparatively simple. In addition, the device in accordance with the invention can be very compact if the source region or the drain region and the memory element are situated one above the other, viewed in projection. This is an important further advantage. For example, this enables the memory element to be incorporated in a so-termed contact metal plug which is customary in many (C)MOS (=(Complementary) Metal Oxide Semiconductor) processes. These are relatively thick and frequently contain a metal such as tungsten.

In a favorable modification, the Schottky junction is formed between the further connection conductor and the ferroelectric layer and forms an ohmic contact with the source region or the drain region of the field effect transistor, while the connection conductor forms an ohmic contact with the ferroelectric layer. As a result, aluminum can be used as the connection conductor, which is quite customary in the silicon technology. As this connection conductor is situated on the outside of the device, and hence is provided in a late stage of the manufacturing process, this connection conductor is not adversely affected by the comparatively high temperatures that are frequently required in the beginning of the manufacturing process. Platinum, which is suitable to form a Schottky junction with the ferroelectric layer, can also suitably be used to form an ohmic contact with an n+-doped source region or drain region of silicon.

Materials that can suitably be used as the material for the connection conductor forming a Schottky junction with the ferroelectric layer are Pt or Au. Ag or Al can very suitably be used as the material of the connection conductor forming an ohmic contact with the ferroelectric layer.

Favorable results are achieved by using a ferroelectric layer comprising as the oxygen-free ferroelectric material a chalcogenide such as $Zn_xCd_{1-x}S$, preferably $Zn_xCd_{1-x}S$ having a Zn content of x ranging between 0.3 and 0.5. Very usable results have also been obtained by using $Cu_2S$ as the oxygen-free ferroelectric material. An important additional advantage of such a material is that it does not contain toxic constituents. Thus, in such a case there is no or substantially no burden on the environment when the device is disposed of for example after its useful life. Another consequence of this is that in particular the safety of the manufacturing environment wherein a device in accordance with the invention is manufactured is improved. Starting materials such as Cd are banned more and more from the manufacturing environment. In the case of $Cu_2S$ use can advantageously be made of Cu and W for the connection conductors. These too are materials that are increasingly permitted and that are applied in the (silicon) semiconductor technology.

Preferably the doping concentration of the oxygen-free ferroelectric material is chosen to be so high that an ohmic contact between the connection conductor or the further connection conductor and the ferroelectric layer is formed, and that, during operation, the electric field in the ferroelectric layer in the conducting state is sufficiently high to switch off the memory element.

Preferably, a device in accordance with the invention comprises a matrix of N×M memory elements, where N and M are natural numbers, and each memory element is connected on both sides to an electric connection. A memory having a large capacity may thus have been formed. Preferably, each memory element is coupled to an associated field effect transistor with a source region, a drain region and a gate electrode, and the device is provided with N first conductor tracks and M second conductor tracks and with a ground connection, and each memory element is connected via the connection conductor to one of the N first conductor tracks and via the further connection conductor to the source region or drain region of the field effect transistor whose drain region or source region is connected to the ground connection, and the gate electrode of the field effect transistor is connected to one of the M second conductor tracks. This construction enables the memory elements to be read while the number of necessary conductor tracks is limited.

Figure 2:
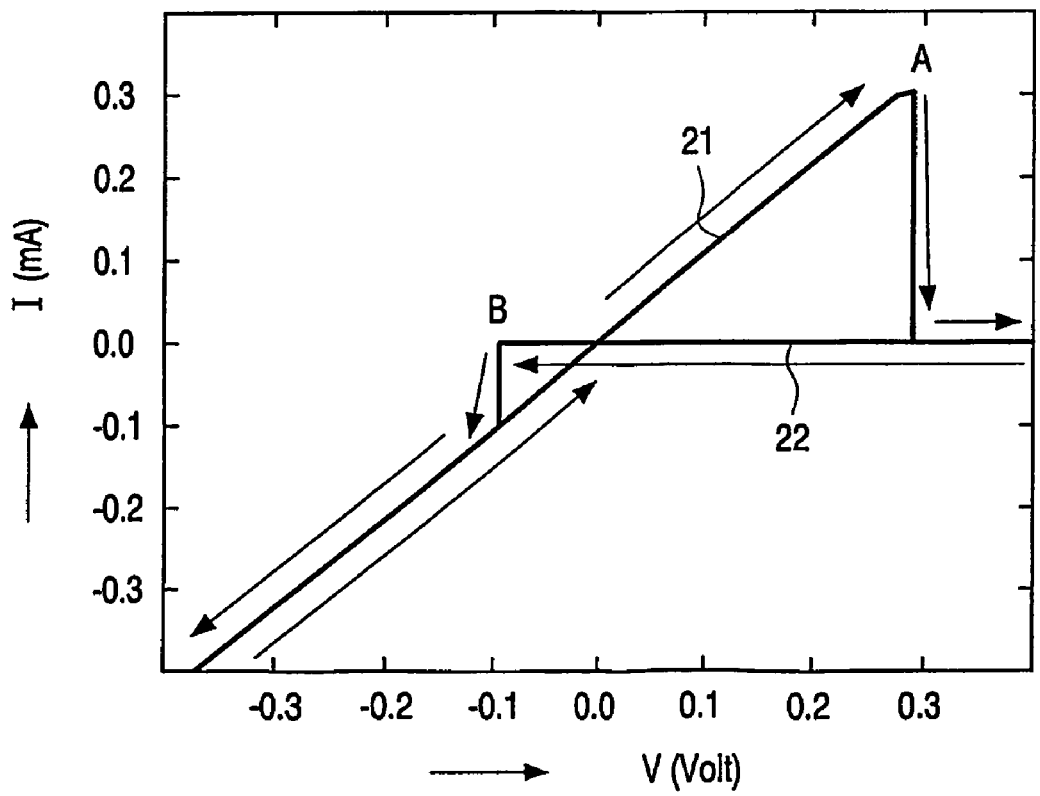

It is to be noted that a device according to the invention may also form a diode like device with important advantages. The advantages of these novel diodes compared with existing diodes are: a low operating voltage for the same forward-reverse current ratio, a high current density in the forward direction and thus a low area for the same forward current and the fact that they do not require a single-crystal substrate. In one embodiment, the device is used as a diode outside a voltage range where a memory effect related to the ferroelectric behavior occurs. This voltage range is shown in FIG. 2 between points A and B.

A method of manufacturing a ferroelectric device in accordance with the invention, wherein a body is formed having a substrate, and the device is provided with a ferroelectric layer which is provided with a connection conductor, an oxygen-free ferroelectric material being used as the material for the ferroelectric layer, and said ferroelectric layer being used to form an active electrical element, is characterized in that a conductive layer is provided between the substrate and the ferroelectric layer, which conductive layer is used to form a further connection conductor of the ferroelectric layer, and the active electrical element is formed by forming a Schottky junction between the ferroelectric layer and at least one of the connection conductors. In this manner a ferroelectric device having the above-discussed advantages is obtained in a simple manner. In a preferred embodiment, the active electrical element is formed as a memory element. Preferably, the body takes the form of a semiconductor body and a, preferably monocrystalline, semiconductor substrate is used as the substrate. Preferably, a field effect transistor with a source region, a drain region and a gate electrode is formed in the semiconductor body, and the further connection conductor is provided on the source region or the drain region of the field effect transistor and formed to a connection conductor of the source region or the drain region.

In a favorable modification, the ferroelectric layer is formed by converting part of a conductive layer to the ferroelectric material, one of the connection conductors being formed by the remaining part of the conductive layer. As a result, the method is simplified and good contact between the metal and the oxygen-free ferroelectric material is obtained. A Cu layer can thus be partly converted to $Cu_2S$.

In a favorable modification, the Schottky junction is formed between the further connection conductor and the ferroelectric layer, which further connection conductor also serves as the connection conductor of the source region or the drain region, while an ohmic contact is formed between the connection conductor and the ferroelectric layer. Preferably a matrix of N×M memory elements is formed, where N and M are natural numbers, and each memory element is provided on both sides with an electric connection. Preferably, each memory element is coupled to a field effect transistor formed in the device and associated with the memory element, which field effect transistor has a source region, a drain region and a gate electrode, and the device is provided with N first conductor tracks and M second conductor tracks and with a ground connection, and each memory element is connected via the connection conductor to one of the N first conductor tracks and via the further connection conductor to the source region or the drain region of the associated field effect transistor whose drain region or source region is coupled to the ground connection, and the gate electrode of the field effect transistor is coupled to one of the M second conductor tracks.

These and other aspects of the invention are apparent from and will be elucidated with reference to the embodiment(s) described hereinafter.

Figure 3:
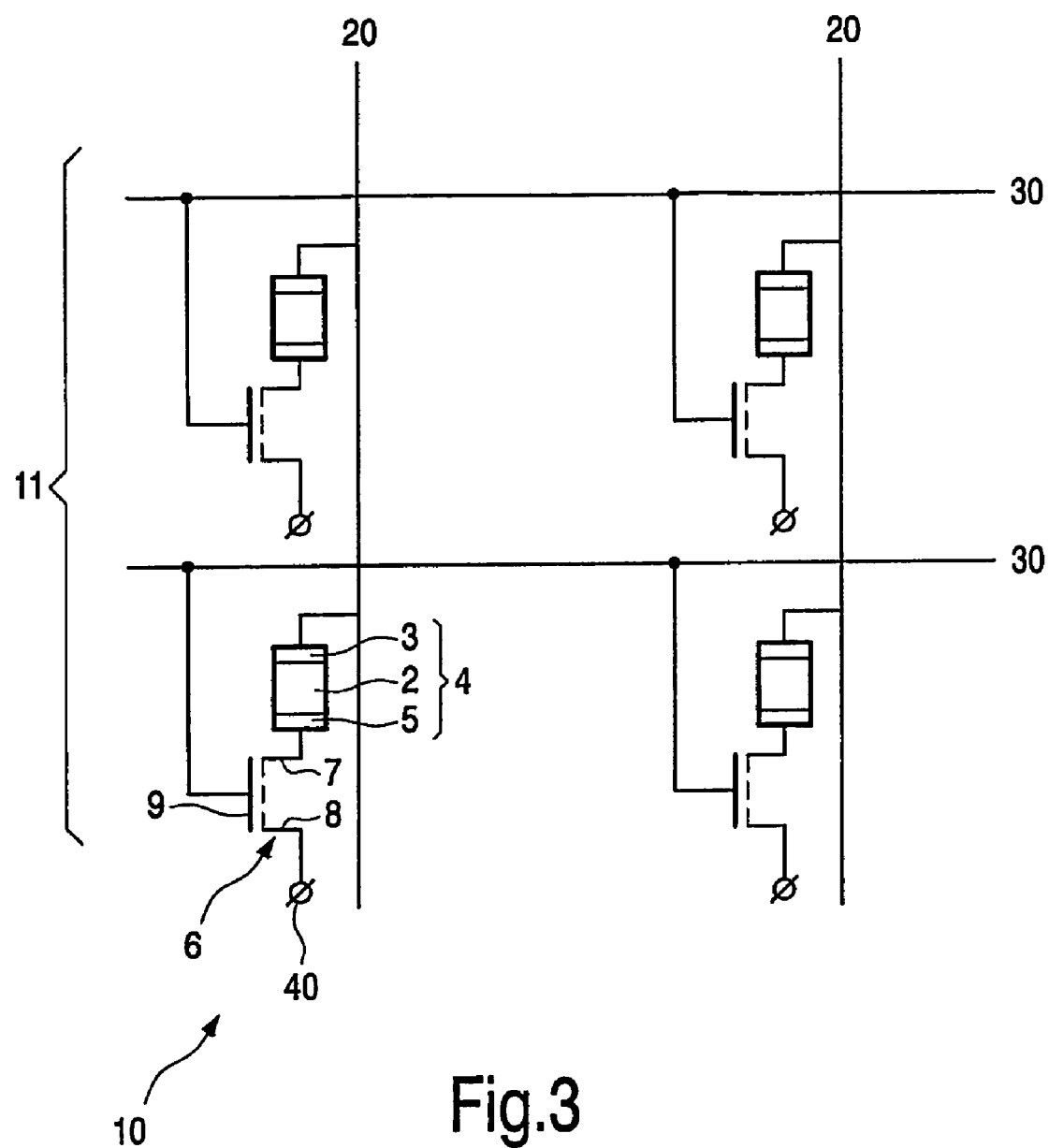
Figure 4:
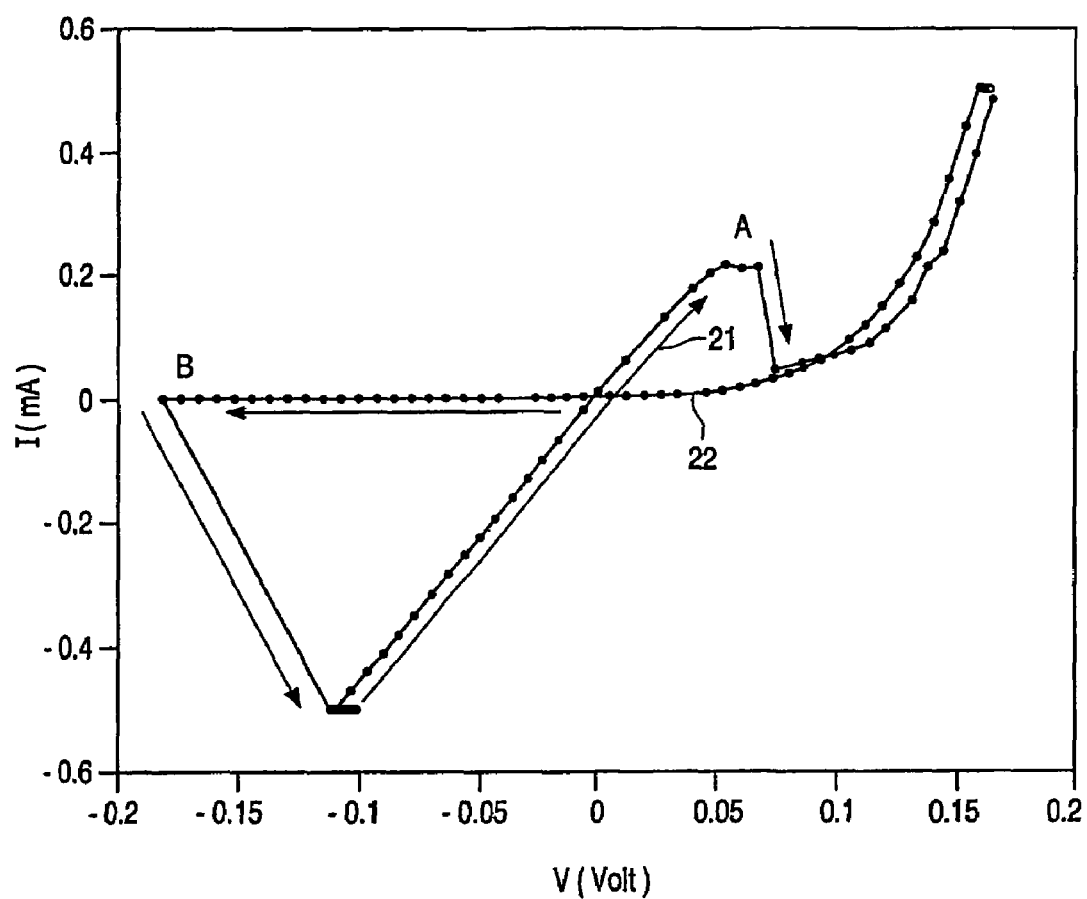

In the drawings:

FIG. 1 is a diagrammatic cross-sectional view, at right angles to the thickness direction, of a ferroelectric device in accordance with the invention, FIG. 2 shows the current-voltage characteristic of the memory element of the device shown in FIG. 1, and FIG. 3 diagrammatically shows the circuit of the device shown in FIG. 1, and FIG. 4 shows the current-voltage characteristic of a modification of the memory element of the device shown in FIG. 1.

The Figures are not drawn to scale and some dimensions, such as dimensions in the thickness direction, are exaggerated for clarity. In the Figures like reference numerals refer to like areas or parts whenever possible.

FIG. 1 is a diagrammatic cross-sectional view, at right angles to the thickness direction, of a ferroelectric device 10 in accordance with the invention. Said device 10 comprises a semiconductor body 11 having a semiconductor substrate 1. This semiconductor device further comprises a ferroelectric layer 2 that is provided with a connection conductor 3 on a side facing away from the substrate 1. By means thereof, in this case a memory element 4 is formed, and the ferroelectric 2 comprises an oxygen-free ferroelectric material, here a chalcogenide.

In accordance with the invention, a conductive layer 5, preferably a metal layer 5, is situated between the semiconductor substrate 1 and the ferroelectric layer 2, which conductive layer forms a further connection conductor 5 of the ferroelectric layer 2, and the memory element 4 is obtained as a result of the fact that the ferroelectric layer 2 forms a Schottky junction with at least one of the connection conductors 3, 5. Such a device 10 can be formed very readily on a semiconductor substrate 1 of silicon and still have a memory element 4 with excellent properties, as will be explained in greater detail hereinafter. An important additional advantage of a device 10 in accordance with the invention resides in that the manufacture thereof is highly compatible with the method customarily used to manufacture silicon devices. The final process step of this method advantageously is an annealing step in a hydrogen-containing atmosphere. Such an annealing step is permissible by virtue of the fact that the ferroelectric material used does not contain oxygen. If the ferroelectric layer 2 were to contain oxygen, hydrogen would readily influence the stoichiometry of the ferroelectric layer and hence the properties of said layer 2.

In this example, the device 10 also comprises a field effect transistor 6 with a source region 7, a drain region 8 and a gate electrode 9, and the further connection conductor 5 is situated on the source region or the drain region, in this case the source region 7 of the transistor 6, and is also used as a connection conductor 5 of the source or drain region 7, 8. In this example, viewed in projection, the memory element 4 is situated within the source region or the drain region; in this case within the drain region 7. As a result, the device 10 is compact and can be manufactured relatively readily. The presence of a field effect transistor 6 is very advantageous if, as in this example, the device 10 comprises a large number of memory elements 4 and each memory element 4 is coupled to a field effect transistor as shown in FIG. 1. The device 10 of this example thus forms a semiconductor memory with a large number of memory elements 4, only one of which is shown in FIG. 1.

In the device 10 of this example, the Schottky junction is formed between the further connection conductor 5, here a platinum layer 5, and the ferroelectric layer 2, here a $Zn_xCd_{1-x}S$ layer 2 having a Zn content x of approximately 40 at. %. Via a thin, here 10 nm, Ti layer 15 which serves as a barrier, the platinum 5 forms an ohmic contact with the source region 7 of transistor 6. The connection conductor 3, here containing Ag, forms an ohmic contact with the ferroelectric layer 2. The thicknesses of the layers are 100 nm for the $Zn_xCd_{1-x}S$ layer 2, 50 nm for the Pt layer 5 and 50 nm for the Ag layer 3. The lateral dimensions of the memory element 4 are, in this example, 1 µm×1 µm. A suitable thickness for the $Zn_xCd_{1-x}S$ layer ranges between 25 nm and 500 nm. The doping concentration of the $Zn_xCd_{1-x}S$ layer 2 is chosen to be such that, on the one hand, it is high enough to enable an ohmic contact to be established between the further connection conductor 5 and the ferroelectric layer 2. On the other hand, the doping concentration should not be chosen to be so high that, during operation, the electric field in the ferroelectric layer 2 in the conducting state is not high enough to switch off the memory element. The operation of the device 10 and, in particular, of the memory element 4 will be illustrated hereinafter with reference to FIG. 2.

FIG. 2 shows the current-voltage characteristic of the memory element 4 of the device 10 of this example. At the origin, where the element 4 is in a state of low impedance, the current I rises with increasing voltage V in accordance with curve 21. At point A, where the voltage is approximately +0.3 volt, the $Zn_xCd_{1-x}S$ layer 2 changes its polarization and the element 4 switches to the high-impedance state. A further increase of the voltage V has no further effect. If the voltage V is reduced, the element V remains in the high-impedance state shown in curve 22 until the reverse switching voltage is reached at approximately −0.1 volt, indicated in the Figure by means of point B. From that moment the element is (again) in the low-impedance state shown in curve 21. A further reduction of the voltage V to −0.4 volt has no further effect. The operation of the device 10 will normally be as follows: bring the element 4 to the high-impedance state ("0") by means of a short voltage pulse of +0.4 V, and to the low-impedance state ("1") by means of a short voltage pulse. Read the impedance of the element 4 at a low voltage V, such as a voltage V whose absolute value is smaller than approximately 0.1 V. As mentioned hereinabove, the device 10 comprises a large number of memory elements 4, four of which are shown in FIG. 3.

FIG. 3 diagrammatically shows the circuit of the device 10 of this example. The device 10 comprises a number, for example 100, of first conductor tracks 20, two of which are shown in FIG. 3, and a number, here also 100, of second conductor tracks 30, two of which are shown in FIG. 3. Each element 4 is connected via a connection conductor 3 to one of the first conductor tracks 20 and via the further connection conductor 5 to the source region 7 of the transistor 6. The drain region 8 of the transistor 6 is connected to a ground connection 40, while the gate electrode 9 of the transistor 6 is connected to one of the second conductor tracks 30. Thus, by applying a voltage to the gate electrode 9, it is possible to select, via the transistor 6, the associated element 4 to adjust and/or read the impedance state.

The device 10 of this example is manufactured in the following manner by means of a method in accordance with the invention. There is started from (see FIG. 1) a (100) silicon substrate 1 with a p-type doping in a low doping concentration. In said substrate there is formed, in a manner which is known per se using customary processes, an N-MOS transistor 6 having n-type source regions 7 and drain regions 8 surrounded by LOCOS (=LOCal Oxidation of Silicon) regions 12. Below these, on the side of the drain region 8, a part of an n-type region 13 is visible in this case, wherein a complementary P-MOS transistor, not shown, is formed. The gate electrode 9 is made of n-type polycrystalline silicon and is surrounded by isolating layers 14 containing silicon dioxide and/or silicon nitride. A titanium layer 15 and a platinum layer 5 are applied to the source region 7 and the drain region 8 by means of, for example, sputtering and form an ohmic contact with said regions. Locally, here at the location of the source region 7, a $Zn_xCd_{1-x}S$ layer is provided thereon by means of sputtering. This technique is particularly suitable for applying $Zn_xCd_{1-x}S$ of a stoichiometric composition, here containing 40 at. % Cd. At the location of the source region 7, the patterned $Zn_xCD_{1-x}S$ layer 2 is provided with a silver layer 3 forming an ohmic contact with the $Zn_xCd_{1-x}S$ layer 2. The conductive layers 3, 5 are separated from the first and the second conductor tracks 20, 30 by means of a silicon dioxide layer, not shown, which is provided, for example, by means of CVD (=Chemical Vapor Deposition). The same applies to the mutual insulation of the first and the second conductor tracks 20, 30 which, as shown in FIG. 3, are connected to each transistor 6 and each memory element 4. The manufacturing process is completed by providing a silicon nitride protective layer, not shown, after which the device 10 is annealed by means of an annealing step in a hydrogen-containing atmosphere.

FIG. 4 shows the current-voltage characteristic of another modification of the memory element 4 of the device 10 of the above-described example. In this example the memory element 4 comprises a ferroelectric layer 2 containing $Cu_2S$ as the oxygen-free ferroelectric material. The connection conductor 3 and the further connection conductor 5 contain, respectively, Cu and W in this example. A very important advantage of the device of this modification is that the elements that it contains are not toxic or at least not appreciably toxic. As a result, the burden on the environment when the disposed of after its useful life as well as its permissibility in a manufacturing environment are substantially improved. The image shown in FIG. 4 corresponds substantially to the invention reference is made to the description pertinent to FIG. 2, the safety of the manufacturing environment wherein a device in accordance with the invention is manufactured is improved.

In the device shown in FIG. 4, the $Cu_2S$ is formed preferably, like in this modification, by partly converting a Cu layer $Cu_2S$. In this case, such a conversion is carried out by treating a Cu layer with an aqueous solution of $K2S_x$, where x>1. This has the advantage that, simultaneously with the oxygen-free ferroelectric layer, one of the two connection conductors is formed by, in this case, the remaining Cu layer.

Other modifications of devices in accordance with the invention can be formed in a simple manner by choosing different oxygen-free ferroelectric materials for the ferroelectric layer 2, such as, in particular, ferroelectric materials within the groups of compounds referred to as picnides, chalcogenides and halogenides, i.e. compounds of one or more elements, of which one or more elements are from main group V, VI (with the exception of oxygen) and VII of the periodic system of elements, and mixed crystals thereof. Theoretically suitable oxygen-free ferroelectric materials are, for example, $Al_5C_3N$, $Al_7C_3N_3$, $Sb_2S_3$, $Bi_2S_3$, $Bi_2S$, $Bi_{0.5}Sb_{1.5}S_2$, $TaInS_2$, $TaNbSe_2$, $TlSbSe_2$, $Bi_{0.5}Sb_{1.5}S_2$, $Ga_xGe_{1-x}Te$, where 0<x<1, SbSI, $Cs_3BiCl_6$, $AMX_3$, where A=Cs or Rb and M=Ca, Cr, Ti, V or Cu and X=F, Cl, Br or I, $BaMF_4$, where M=Mg, Mn, Fe, Co, Ni, Cu or Zn, $SrAlF_5$, $K_2MF_6$, where M=Mn, Cr, Ti or Pd, $A_3M_3F_{19}$, where A=Sr, Ba or Pb and M=Al, Ti, V, Cr, Fe or Ga. Of these oxygen-free ferroelectric materials, $Bi_2S_3$ and SbSI have a comparatively low Curie temperature, which limits the practical use of these materials. The same applies to the compounds of thallium, due to the toxicity of these compounds. The practical use of the compounds listed above, starting from $Cs_3BiCl_6$, may be limited by too high an ionic conductance, which may cause the data stored to be lost.

An example of a ferroelectric device according to the invention in which the active element is a diode-like device was realized with a ferroelectric layer comprising ZnCdS between a platinum layer and a silver layer. Especially low (forward) voltages are obtained when the ferroelectric semiconductor layer is thin an/or has a low coercive field and/or a Curie temperature which is close to the operating temperature. Typical values for the coercive field (kV/cm), the film thickness (nm) and switch voltage (V) are: 20 kV/cm, 30 nm and 0.06 V respectively, or 30 kV/cm, 30 nm and 0.06 V respectively, or 40 kV/cm, 15 nm and 0.06 V respectively.

The invention is not limited to the above-described example and, within the scope of the invention, many variations and modifications are possible to those skilled in the art. For example, devices having a different geometry and/or different dimensions can be manufactured. It is also possible to employ different materials for, in particular, the connection conductors, such as hafnium carbide or other binary materials.

What has been observed hereinabove regarding the device also applies to the manufacture thereof. As well as the above-mentioned techniques for applying the ferroelectric layer, also MBE (=Molecular Beam Epitaxy), (MO)VPE (=(Metal Organic) Vapor Phase Epitaxy or CVD (=Chemical Vapor Deposition) or PLD (Pulsed Laser Deposition) can be used.

It is further noted that the device may comprise further active and passive semiconductor elements such as diodes and/or transistors and resistors and/or capacitance's. This enables additional circuits to be advantageously formed which are capable of fulfilling additional functions.

Finally, it is noted again that a device in accordance with the invention may also advantageously comprise a substrate other than a monocrystalline substrate. Also a substrate of a conductor, such as a metal, or of an insulator, such as glass, ceramic or synthetic resin can be advantageously applied.

The invention claimed is:

1. A method of manufacturing a ferroelectric device
   wherein a body is formed that comprises a substrate, and the device is provided with a ferroelectric layer having a connection conductor on a side facing away from the substrate,
   an oxygen-free ferroelectric material being selected as the material for the ferroelectric layer which is used to form an active electrical element, forming a field effect transistor in the substrate, the field effect transistor having a source region, a drain region and a gate electrode, applying a barrier layer directly to the source region or the drain region, applying a conductive layer directly to the baffler layer, characterized in that the conductive layer is provided between the substrate and the ferroelectric layer, and the conductive layer forms a further connection conductor of the ferroelectric layer, and the active electrical element is obtained by forming a Schottky junction between the ferroelectric layer and at least one of the connection conductors.

2. A method according to claim 1, characterized in that the active electrical element is formed as a memory element.

3. A method as claimed in claim 2, characterized in that the body is formed so as to be a semiconductor body, and a semiconductor substrate is selected as the substrate.

4. A method as claimed in claim 2, characterized in that the further connection conductor is formed so as to be a connection conductor of the source region or drain region.

5. A method as claimed in claim 2, characterized in that the Schottky junction is formed between the further connection conductor and the ferroelectric layer, and an ohmic contact is formed between the connection conductor and the ferroelectric layer as well as between the further connection conductor and the source or drain region of the field effect transistor.

6. A method as claimed in claim 2, characterized in that the ferroelectric layer is formed by converting part of a conductive layer to the ferroelectric material, one of the connection conductors being formed by the remaining part of the conductive layer.

7. A method as claimed in claim 2, characterized in that a matrix of N×M memory elements is formed, where N and M are natural numbers and each memory element is provided on both sides with an electric connection.

8. A method as claimed in claim 2, characterized in that each memory element is coupled to a field effect transistor formed in the device and associated with said memory element, which field effect transistor comprises a source region, a drain region and a gate electrode, and the device is provided with N first conductor tracks, M second conductor tracks and with a ground connection, and each memory element is connected via the connection conductor to one of the N first conductor tracks and via the further connection conductor to the source or drain region of the associated field effect transistor, of which the other drain or source region is connected to the ground connection, while the gate electrode is connected to one of the M second conductor tracks.

9. A method of manufacturing a ferroelectric device wherein a body is formed tat comprises a substrate, and the device is provided with a ferroelectric layer having a connection conductor on a side facing away from the substrate, an oxygen-free ferroelectric material being selected as the material for the ferroelectric layer which is used to form an active electrical element, characterized in that a conductive layer is provided between the substrate and the ferroelectric layer, and the conductive layer forms a further connection conductor of the ferroelectric layer, and the active electrical element is obtained by forming a Schottky junction between the ferroelectric layer and at least one of the connection conductors, and characterized in that the ferroelectric layer is formed by converting part of a conductive layer to the ferroelectric material, one of the connection conductors being formed by the remaining part of the conductive layer.

10. A method according to claim 9, characterized in that the active electrical element is formed as a memory element.

11. A method as claimed in claim 10, characterized in that the body is formed so as to be a semiconductor body, and a semiconductor substrate is selected as the substrate.

12. A method as claimed in claim 10, characterized in that in the semiconductor body there is formed a field effect transistor with a source region, a drain region and a gate electrode, and the further connection conductor is provided on the source or drain region of the field effect transistor and is formed so as to be a connection conductor of the source region or drain region.

13. A method as claimed in claim 12, characterized in that the Schottky junction is formed between the further connection conductor and the ferroelectric layer, and an ohmic contact is formed between the connection conductor and the ferroelectric layer as well as between the further connection conductor and the source or drain region of the field effect transistor.

14. A method as claimed in claim 9, characterized in that a matrix of N×M memory elements is formed, where N and M are natural numbers and each memory element is provided on both sides with an electric connection.

15. A method as claimed in claim 14, characterized in that each memory element is coupled to a field effect transistor formed in the device and associated with said memory element which field effect transistor comprises a source region, a drain region and a gate electrode, and the device is provided with N first conductor tracks, M second conductor tracks and with a ground connection, and each memory clement is connected via the connection conductor to one of the N first conductor tracks and via the further connection conductor to the source or drain region of the associated field effect transistor, of which the other drain or source region is connected to the ground connection, while the gate electrode is connected to one of the M second conductor tracks.

* * * * *